United States Patent [19]
Inoue et al.

[11] Patent Number: 5,635,763
[45] Date of Patent: Jun. 3, 1997

[54] SEMICONDUCTOR DEVICE HAVING CAP-METAL LAYER

[75] Inventors: Yasunori Inoue; Kazutoshi Tsujimura; Shinichi Tanimoto, all of Ohgaki; Yasuhiko Yamashita, Hashima; Kiyoshi Yoneda; Yoshikazu Ibara, both of Gifu-ken, all of Japan

[73] Assignee: Sanyo Electric Co., Ltd., Osaka, Japan

[21] Appl. No.: 215,374

[22] Filed: Mar. 21, 1994

[30]  Foreign Application Priority Data

| Mar. 22, 1993 | [JP] | Japan | 5-061878 |
| Sep. 24, 1993 | [JP] | Japan | 5-238107 |
| Jan. 24, 1994 | [JP] | Japan | 6-005846 |
| Feb. 21, 1994 | [JP] | Japan | 6-022868 |

[51] Int. Cl.$^6$ ................................. H01L 23/48
[52] U.S. Cl. ................. 257/763; 257/764; 257/765; 257/770
[58] Field of Search .................... 257/763, 764, 257/770, 765

[56]  References Cited

U.S. PATENT DOCUMENTS

| 5,124,779 | 6/1992 | Furukawa et al. | 257/764 |
| 5,317,187 | 5/1994 | Hindman et al. | 257/763 |
| 5,341,026 | 8/1994 | Harada et al. | 257/763 |
| 5,360,995 | 11/1994 | Craas | 257/763 |
| 5,459,353 | 10/1995 | Kanazawa | 257/751 |
| 5,475,267 | 12/1995 | Ishii et al. | 257/752 |

FOREIGN PATENT DOCUMENTS

| 62-261154 | 11/1987 | Japan | H01L 21/88 |
| 1-255250 | 10/1989 | Japan | H01L 21/90 |
| 2-237108 | 9/1990 | Japan | H01L 21/3205 |
| 2-271631 | 11/1990 | Japan | H01L 21/3205 |
| 4-17338 | 1/1992 | Japan | H01L 21/3205 |
| 4-87336 | 3/1992 | Japan | H01L 21/3205 |
| 4-330768 | 11/1992 | Japan | H01L 21/3205 |

OTHER PUBLICATIONS

Inoue et al., "Behavior of TiN and Ti Barrier Metals on Al–Barrier–Al Via Hole Metallization", pp. 65–72, 1993, *Technical Report of IEICE*, Jun.

Inoue et al., "Reaction at the Via Contact Interface in Double–Level–Aluminum Interconnection", pp. 59–66, 1993, *Technical Report of IEICE*, Aug.

Inoue, et al., "Effect of TiN/Ti Cap Layers On Electromigaration Performance or Al Based Multi–Layered Interconnects", pp. 67–74, 1994, *Technical Report of IEICE*, Jan.

Inoue et al., "Behavior of TiN and Ti Barrier Metals in Al–Barrier–Al Via Hole Metallization", *J. Electrochem. Soc.*, vol. 141, No. 4, Apr., 1994.

*Primary Examiner*—Sara W. Crane
*Assistant Examiner*—Roy Potter
*Attorney, Agent, or Firm*—Sheridan Ross P.C.

[57]  ABSTRACT

A semiconductor device is disclosed, which includes an insulating layer and an interconnection layer having a conductive layer provided over the insulating layer. The interconnection layer is patterned by photolithography. The device further includes a cap-metal layer, which is deposited on the conductive layer and suppresses reflection of light beams at the time of patterning the interconnection layer. The cap-metal layer has any one of the following structures: a double-layered structure having a titanium nitride layer and a titanium layer located between the titanium nitride layer and the conductive layer; a double-layered structure having a titanium nitride layer and an aluminum-titanium alloy layer located between the titanium nitride layer and the conductive layer; and a single-layered structure consisting essentially of an aluminum-titanium alloy. These design ensure accurate interconnection patterning in the photolithography, and provide improved EM and SM immunities of the interconnection.

19 Claims, 10 Drawing Sheets

S: substrate
T: target

SEMICONDUCTOR DEVICE HAVING CAP-METAL LAYER

BACKGROUND OF THE INVENTION

1. Field of the Invention

The present invention relates to a semiconductor device and a method of fabricating the same. More particularly, this invention relates to a multi-layered structure of a semiconductor device which has an interconnection layer and a layer formed thereon to suppress light reflection.

2. Description of the Related Art

Conventional semiconductors are fabricated having interconnections formed between the various regions of the semiconductor. These interconnections are typically fabricated from conductive material deposited on the semiconductor substrate during metallization process and effectively form bonding areas between the various substrates. Depending on the type of conductive material used for the interconnection, various electrical and mechanical characteristics are imparted to the semiconductor, such as reflectance, electromigration (EM), stress migration (SM), and interconnection resistance.

Due to the recent high integration of semiconductor devices, there is a demand to reduce the interconnection widths formed during the fabrication of semiconductors to 0.5 μm or narrower. Interconnection miniaturization, however presents certain difficulties in the operational performance of highly integrated semiconductor devices. Such problems include the deterioration of the electromigration performance and stress migration performance, an increase in interconnection resistance and a reduction in precision of photolithographic patterning, caused by the reflection of exposure light (called "halation") at the surface of the interconnection layer. Semiconductor devices which will overcome those problems are therefore widely sought after. The "electromigration" is a phenomenon wherein the interconnection is disconnected by the migration of aluminum atoms due to the flow of electrons. The "stress migration" is the disconnection of the interconnection caused by thermal stress.

FIG. 1 shows the cross section of a semiconductor device having a conventional multi-layered structure. A silicon oxide ($SiO_2$) film 101 is formed 200 nm thick on a single crystal silicon substrate 100 by the chemical vapor deposition (CVD) method. An aluminum-silicon-copper alloy layer 102 (Al—Si (1% by weight)-Cu (0.5% by weight)) is deposited 500 nm thick on the $SiO_2$ layer 101 by the magnetron sputtering method. A titanium nitride (TiN) layer 103 is formed 20 nm thick on the alloy layer 102 by the reactive sputtering method using titanium (Ti) as a target and a gas mixture consisting of argon and nitrogen as a sputtering gas. According to this reactive sputtering method, titanium sputtered from the target is deposited on the alloy layer 102 while reacting with the nitrogen in the sputtering gas, thus yielding the TiN layer 103. The two layers 102 and 103 form an interconnection layer 104 which is to be patterned by photolithography. The TiN layer 103 serves to suppress reflection of light (e.g., ultraviolet rays) exposed at the surface of the interconnection layer 104 during the photolithography to thereby improve the patterning precision. Such a reflection suppressing layer is generally called "cap metal".

The influence of the light exposed on the surface of the interconnection layer 104 will now be discussed with reference to FIG. 2. The first step of the photolithography is to form a resist 105 (e.g., a positive photoresist) on the interconnection layer 104 (step 1). Light passing through a mask (not shown) is irradiated on a specific area of the resist 105. If no cap metal exists on the surface of the interconnection layer 104, which is in contact with the resist 105 (namely, if the reflectance of the surface of the interconnection layer 104 is high), or if there are undulations on the interconnection layer 104 corresponding to those of the silicon substrate 100, most of the exposure light would be reflected at the surface of the interconnection layer 104 and would be irradiated on a resist 105a around the specific area. This results in inaccurate patterning of the hardened resist that will remain after removal of the unnecessary resist. As a result, the actual size or shape (W1) of the gap between interconnection patterns obtained after etching differs from the desired size or shape (W2).

To address this problem, the cap-metal layer 103 consisting of low-reflectance TiN is formed on the alloy layer 102 in the conventional interconnection layer 104 shown in FIG. 1. If the wavelength of light for measuring the reflectance is 365 nm, which is the same as the wavelength of normal exposure light used in the photolithography, the reflectance of the interconnection layer 104 having the TiN layer 103 is reduced to about 30%, which is considerably lower than that of the interconnection layer that consists only of the alloy layer 102.

While the conventional interconnection layer 104 having the TiN layer 103 is satisfactory in suppressing halation, it does not sufficiently achieve the currently demanded levels of the other performances like the EM immunity and SM immunity.

SUMMARY OF THE INVENTION

Accordingly, it is a primary objective of the present invention to provide a highly reliable semiconductor device with improved EM performance and SM performance without reducing the patterning precision of the interconnection during photolithographic processing.

It is another objective of this invention to provide a method of fabricating such a semiconductor device efficiently.

To achieve the foregoing and other objects and in accordance with the purpose of the present invention, an improved semiconductor device is provided. The semiconductor device according to this invention includes an insulating layer and an interconnection layer having a conductive layer provided over the insulating layer. The interconnection layer is patterned by photolithography to form an interconnection having a desired pattern. The semiconductor device further includes a layer, i.e. cap-metal layer, which is deposited on the conductive layer and suppresses reflection of light beams at the time of the patterning the interconnection layer. The cap-metal layer according to this invention has any one of the following structures:

(1) A double-layered structure having a titanium nitride layer and a titanium layer located between the titanium nitride layer and the conductive layer;

(2) A double-layered structure having a titanium nitride layer and an aluminum-titanium alloy layer located between the titanium nitride layer and the conductive layer; and (3) A single-layered structure consisting essentially of an aluminum-titanium alloy.

It is desirable that the aluminum-titanium alloy in the structures (2) and (3) be an aluminum-titanium based intermetallic compound selected from the group consisting of $Al_3Ti$, $AlTi_3$ and $AlTi$.

The cap-metal layer according to this invention, together with the conductive layer, constitutes an interconnection layer in the semiconductor device. This design ensures accurate interconnection patterning in the photolithography. In addition, the interconnection layer will have improved EM immunity and SM immunity.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings.

FIGS. 3A and 3B are cross-sectional views showing the multi-layered structure of semiconductor devices;

FIG. 4 is a cross-sectional view showing a modification of the structure in a contact hole in the semiconductor device in FIG. 3A;

FIG. 5 is a cross-sectional view showing an another modification of the structure in a contact hole in the semiconductor device in FIG. 3A;

FIG. 6 shows the results of the evaluation of the EM immunities of a TiN/Ti double-layered cap and a TiN single-layered cap;

FIG. 7 shows the relation between the thickness of a Ti film and the mean time to failure (MTTF) as an index for the EM immunity;

FIG. 8 shows the relation between the total thickness of the cap film and the MTTF;

FIG. 9 shows the relation between the thickness of an aluminum-titanium alloy layer formed by sintering and the MTTF;

FIG. 10 shows the relation between the time of applying EM stress and an interconnection resistance;

FIG. 11 shows the results of measuring the reflectance of light of the TiN/Ti double-layered cap and those of comparative examples; and FIG. 12 shows the results of measuring the contact resistance of the TiN/Ti double-layered cap and the TiN single-layered cap.

FIGS. 13 through 18 illustrate a second embodiment of this invention:

FIG. 13 is a cross-sectional view showing the multi-layered structure of a semiconductor device;

FIG. 14 is a schematic diagram of a magnetron sputtering device;

FIG. 16 shows the relation between the time to failure and cumulative failure; and FIG. 17 shows the relation between the thickness of a cap-metal layer and the MTTF.

FIG. 18 is a cross-sectional view showing the multi-layered structure of a semiconductor device according to a modification of the second embodiment.

DETAILED DESCRIPTION OF THE PREFERRED EMBODIMENTS

First Embodiment

Figure 3A:
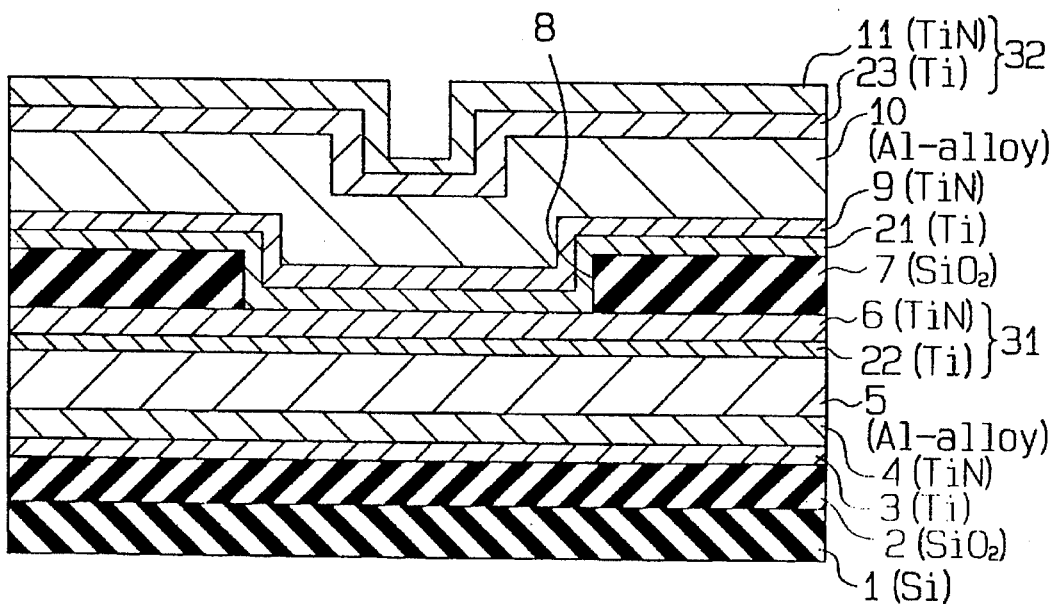
FIGS. 3A, 3B and 4 to 12 illustrate a first embodiment of the present invention.

A first embodiment of the present invention will now be described referring to the accompanying drawings. FIG. 3A shows a semiconductor device according to this embodiment. A first silicon oxide ($SiO_2$) layer 2 is formed 600 nm thick on a single crystal silicon substrate 1 by CVD. A titanium (Ti) layer 3 (50 nm thick), a titanium nitride (TiN) layer 4 (100 nm thick) and a first aluminum alloy layer 5 (500 nm thick) are formed in order on the $SiO_2$ layer 2 by magnetron sputtering. A Ti layer 22 (10 nm thick) and a TiN layer 6 (20 nm thick) are formed on the aluminum alloy layer 5 by magnetron sputtering. The aluminum alloy layer 5 forms a first interconnection layer together with a first cap-metal layer 31, which consists of the Ti layer 22 and TiN layer 6 and serves as a reflection suppressing film.

A second $SiO_2$ layer 7 (600 nm thick) is formed, which serves as an insulating layer, on the TiN layer 6 by CVD. A contact hole 8 (called a via hole or a via contact) is formed in the $SiO_2$ layer 7 by ordinary photolithographic patterning and subsequent dry etching. A Ti layer 21 (50 nm thick) and a TiN layer 9 (100 nm thick) are formed on the surface of the $SiO_2$ layer 7 and the bottom and inner wall of the contact hole 8 by sputtering. A second aluminum alloy layer 10 (500 nm thick), a Ti layer 23 (10 nm thick) and a TiN layer 11 (20 nm thick) are stacked on the TiN layer 9 in the same manner as described above. The second aluminum alloy layer 10 forms a second interconnection layer together with a second cap-metal layer 32, which consists of the Ti layer 23 and TiN layer 11 and serves as a reflection suppressing film.

The first and second interconnection layers are patterned using the ordinary photolithography. The sputtering method for forming a thin film may be diode sputtering, high-frequency sputtering or tetrode sputtering besides the magnetron sputtering. The $SiO_2$ layers 2 and 7 may be prepared by a method other than the CVD method, such as the PVD method including sputtering or vapor deposition. The $SiO_2$ layers 2 and 7 may be substituted by layers made of an insulating material other than silicon oxide, such as various silicate glasses, alumina, silicon nitride, titanium oxide or organic insulating material (e.g. polyimide).

Figure 3B:
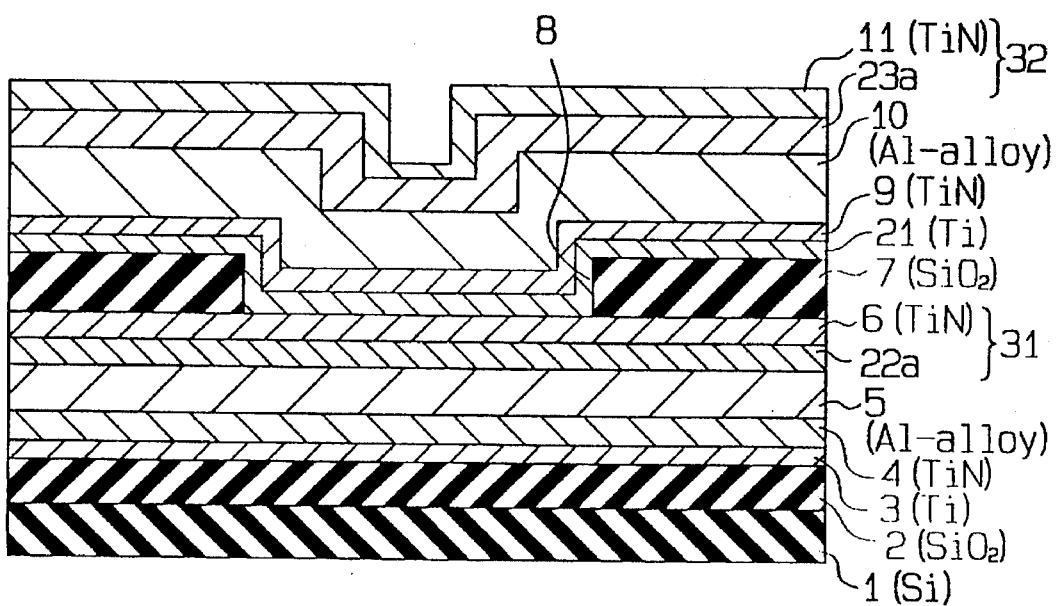

It is preferable that after the formation of the multi-layered structure shown in FIG. 3A, this semiconductor device should be sintered in either a forming gas or a nitrogen gas at 400° to 470° C. for 10 minutes to 60 minutes (preferably about 30 minutes). The sintering is normally carried out to enhance the bonding between layers. However, it has been confirmed that the sintering causes the Ti layer 22 or 23 constituting the cap-metal layer 31 or 32 to react with the directly underlying aluminum alloy layer 5 or 10 in the multi-layered structure of this embodiment. In other words, the sintering causes titanium in the Ti layer 22 or 23 to be diffused in the aluminum alloy layer 5 or 10 and causes aluminum in the aluminum alloy layer 5 or 10 to be diffused in the Ti layer 22 or 23. This diffusion phenomenon produces alloy layers 22a and 23a consisting of an intermetallic compound expressed by a composition formula of $Al_3Ti$, in the Ti layers 22 and 23 and parts of aluminum alloy layers 5 and 10, as shown in FIG. 3B. In this manner, the cap-metal layers 31 and 32 respectively includes the aluminum-titanium alloy layers 22a and 23a besides the TiN layers 6 and 11.

Figure 4:
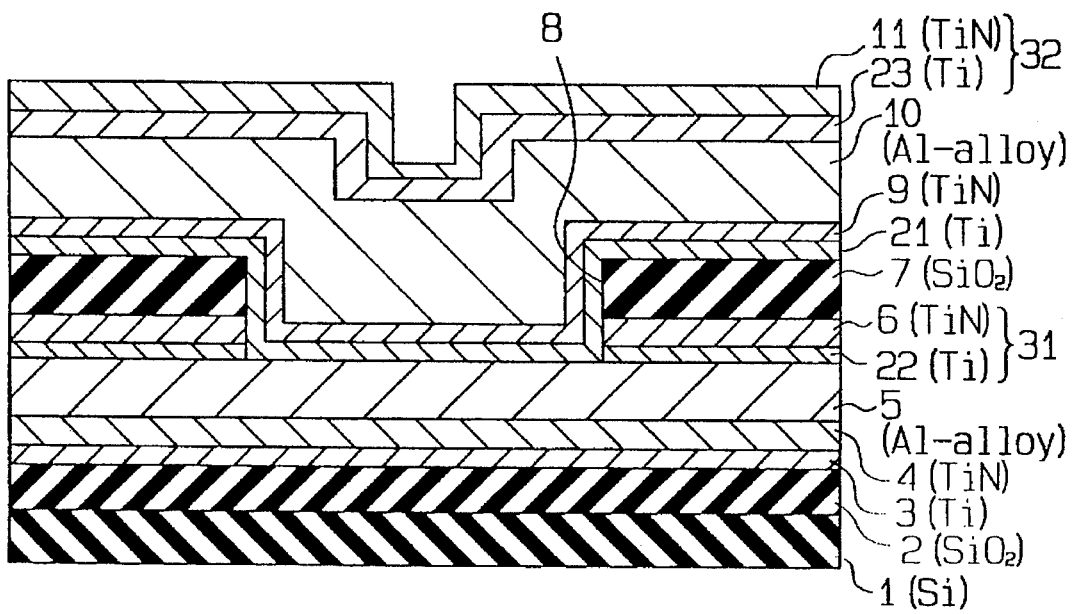

There are several other examples for the structure in the contact hole 8. First, sputter etching may be conducted with an inert gas (e.g., argon) immediately after the formation of the contact hole 8 to remove an etching scum in the contact hole 8 or parts of the Ti layer 22 and TiN layer 6 in the contact hole 8. The semiconductor device fabricated by the method containing this additional sputter etching step has a multi-layered structure as shown in FIG. 4. This etching step may be replaced with reactive ion beam etching (RIBE) which uses a reactive gas (e.g., $CCl_4$ or $SF_6$).

Figure 5:
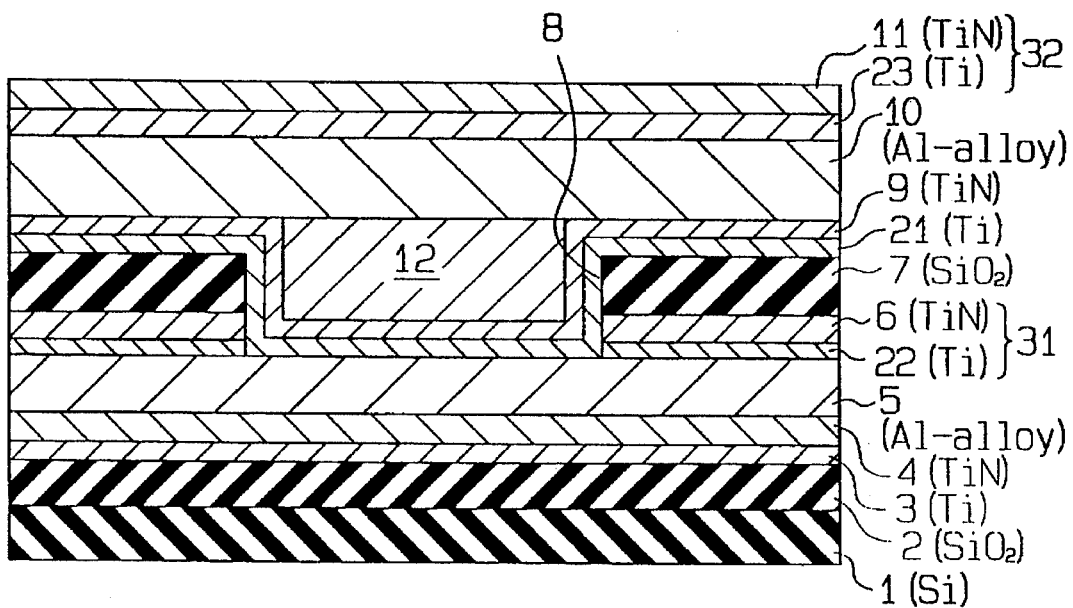

Secondly, a tungsten plug 12 as a connecting insertion may be formed in the contact hole 8 to fill the hole 8 after such sputter etching or RIBE and the subsequent formation of the Ti layer 21 and TiN layer 9, as shown in FIG. 5. The tungsten plug 12 is prepared by blanket tungsten CVD and the subsequent etch back on the surface of the TiN layer 9. The tungsten plug 12 may be substituted by a plug made of another metal like aluminum, nickel or copper. The semiconductor devices shown in FIGS. 4 and 5 may of course be sintered at 400° to 470° C.

Examples of the aluminum alloy for the first and second alloy layers 5 and 10 include Al (98.5% by weight)- Si (1% by weight)-cu (0.5% by weight), Al—Cu, Al—Si, Al—Ti and other aluminum alloy including any one of magnesium (Mg), palladium (Pd), scandium (Sc) and hafnium (Hf). The layers 5 and 10 may be made of copper (Cu), silver (Ag) or Gold (Au). The use of an aluminum alloy as an interconnection material is advantageous over the usage of pure aluminum in preventing or suppressing electromigration and stress migration.

The Ti layer 3 and TiN layer 4 located between the first $SiO_2$ layer 2 and the first aluminum alloy layer 5 serve as barrier metal. More specifically, when the semiconductor device having no barrier-metal layer is heated after the formation of the first interconnection layer (layers 5, 22 and 6), silicon (Si) is diffused from the Si substrate 1 into the aluminum alloy layer 5 via a contact hole (not shown) which may be formed in the $SiO_2$ layer 2. The diffused silicon reacts with aluminum in the alloy layer 5 to produce silicone nodules in the contact hole. The silicone nodules will reduce the conductivity of the interconnection between two interconnection layers, formed in the contact hole, thus causing an electric disconnection between both interconnection layers. The barrier-metal layer in this embodiment serves to prevent the electric disconnection in the contact hole due to the formation of silicone nodules. Additionally, in the case of pure aluminum interconnection, aluminum spikes may be produced from the bottom of the contact hole into the silicone substrate. It may be possible for such spikes to destroy p-n junction.

The TiN layer 4 has particularly excellent barrier characteristics for inhibiting the reaction between aluminum and silicon. The reason for combining the TiN layer 4 with the Ti layer 3 is that the barrier-metal layer including the Ti layer 3 reduces the contact resistance more than the barrier-metal layer which consists only of a TiN layer.

The TiN layer 9 located between the second $SiO_2$ layer 7 and the second aluminum alloy layer 10 inhibits the growth of "Hillock" produced by the heat treatment such as sintering. It has been confirmed that significant Hillock did not occur even when the semiconductor device according to this embodiment is subjected to a heat treatment at 450° C. for 60 minutes. Generally speaking, the growth of Hillock will cause short-circuit of two interconnection layers and/or short-circuit of adjacent interconnections in an interconnection layer.

Further, the TiN layer 9 located immediately below the second aluminum alloy layer 10 is essential in the blanket tungsten-CVD method which is used to form the tungsten plug 12 as shown in FIG. 5. The Ti layer 21 and $SiO_2$ layer 7 have poor bonding characteristic with respect to a tungsten film. A tungsten film, even if formed on the Ti layer 21 or $SiO_2$ layer 7, is therefore easily separable. The TiN layer 9 serves as an adhesion for securing the tungsten plug 12 in the contact hole 8.

EM Performance

The cap metal having the TiN/Ti double-layer structure improves the EM performance in a semiconductor device compared with the conventional TiN single-layered cap metal. As an index to evaluate the EM performance, time to failure or mean time to failure (MTTF) is generally used.

Figure 6:
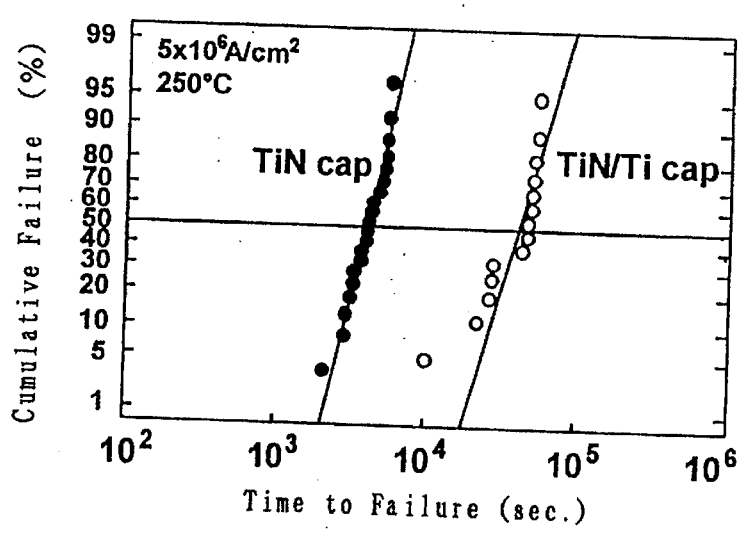

FIG. 6 presents a LOG-NOMAL plot of the results of the time to failure of the cap having stacked TiN (20 nm) and Ti (30 nm) and the TiN cap (20 nm). Both samples were sintered at 450° C., and the experiment was conducted at a sample temperature of 250° C. and at a current density of $5 \times 10^6$ A/cm$^2$. FIG. 6 shows the TiN/Ti layered cap having about ten times longer life than the TiN cap.

Figure 7:
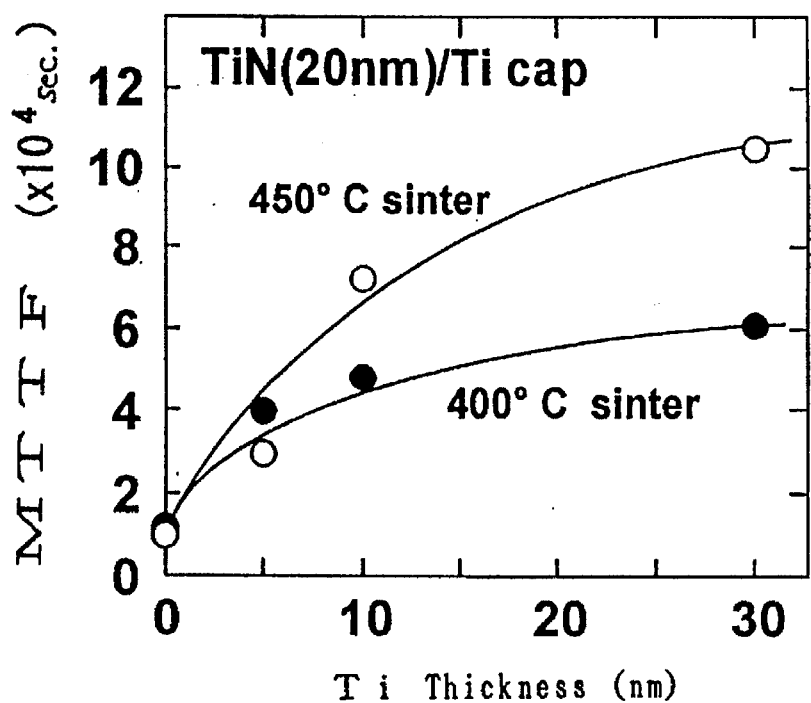

FIG. 7 shows the relation between the MTTF and the thickness of the Ti layer in the TiN/Ti double-layered cap. The sample used in this experiment to measure the MTTF has a multi-layered structure of TiN (20 nm)/Ti (0 to 30 nm)/Al—Si—Cu (600 nm; formed at 200° C.)//TiN (100 nm)/Ti (50 nm). This multi-layered structure corresponds to the structure of the TiN 11/Ti 23/Al alloy 10//TiN 9/Ti 21 as shown in FIG. 3A. In this experiment, the multi-layered sample was formed on p-TEOS-NSG and passivation of a p-SiN/PSG structure was used. FIG. 7 shows that as the thickness of the Ti layer becomes thicker, the MTTF becomes longer and the EM performance is improved. Although the MTTF varies depending on the sintering temperature (400° C. and 450° C. in this case), it increases with an increase in the thickness of the Ti layer.

Figure 8:
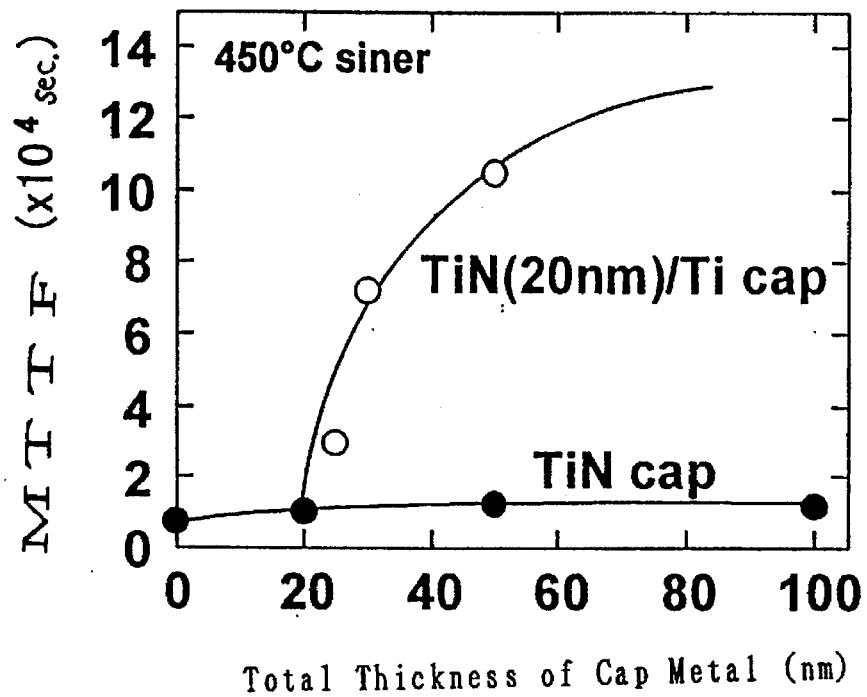

FIG. 8 shows the relation between the MTTF and the total film thickness of the TiN/Ti double-layered cap. In this case, the thickness of the TiN layer in the TiN/Ti double-layered cap is fixed to 20 nm and the total thickness is changed by altering the film thickness of the Ti layer. For the purpose of comparison, the relation between the thickness of the TiN single-layered cap and the MTTF is also plotted on the graph. FIG. 8 shows that the EM performance has been improved significantly with an increase in the thickness of the Ti layer in the TiN/Ti double-layered cap. On the contrary, the EM performance in the TiN single-layered cap is kept almost constant in spite of an increase in the thickness.

Figure 9:
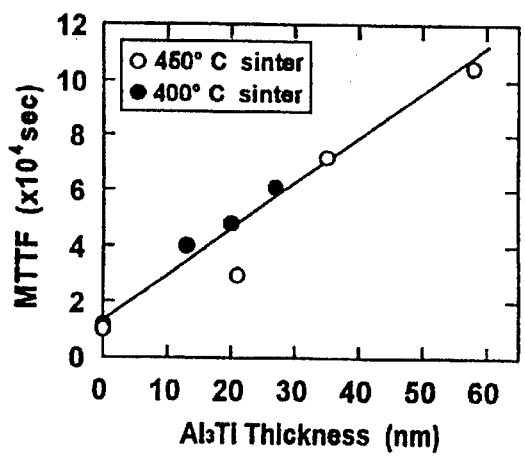

In the case of the device as shown in FIG. 3B with the sintering applied, it is found that the thicknesses of the Al$_3$Ti alloy layers 22a and 23a after sintering have a correlation with the thicknesses of the Ti layers 22 and 23 before sintering and the sintering temperature. Further, the thicknesses of the Al$_3$Ti alloy layers 22a and 23a have a nearly positive correlation with the MTTF (i.e., the EM performance), as shown in FIG. 9.

Figure 10:
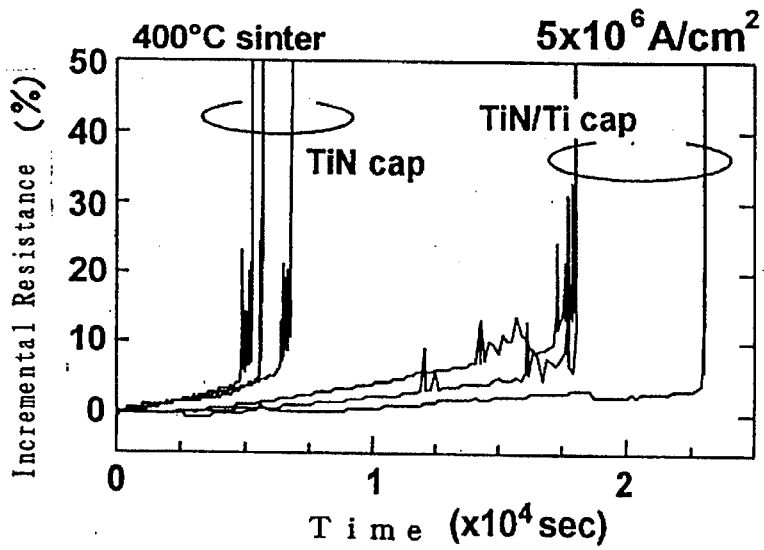

The electromigration (EM) affects the interconnection resistance. FIG. 10 shows the relation between interconnection resistance and the time of applying EM stress on the interconnection having a TiN/Ti double-layered cap and the interconnection having a TiN single-layered cap. Either interconnection is broken after the interconnection resistance increases and a minute resistance variation occurs. However, the interconnection having the TiN/Ti double-layered cap exhibits a much more gradual incremental resistance with respect to time compared with the interconnection having the TiN cap.

It is apparent from the above that the double-layer cap structure of TiN/Ti or TiN/Al$_3$Ti will suppress the migration of Al atoms at the interface between the cap-metal layer and the interconnection aluminum alloy layer as compared with the case where the TiN single-layered cap is used, thus improving the EM performance. In particular, the Al$_3$Ti alloy layer serves as a more effective bypass at an interconnection layer as compared with the TiN layer and has an excellent EM immunity.

Reflectance

Figure 11:
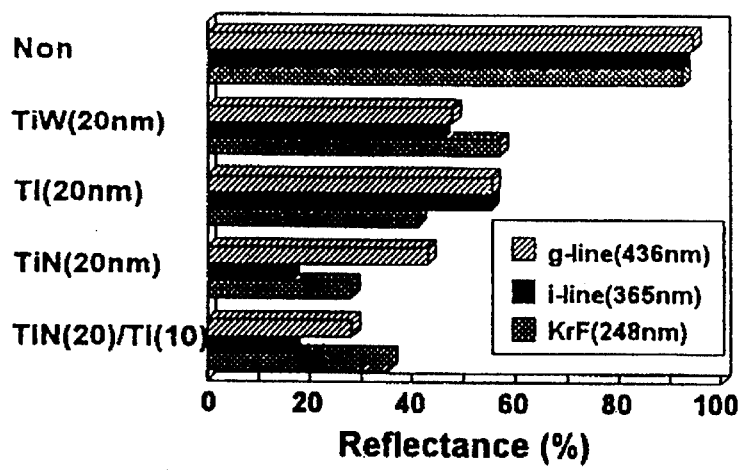

The TiN/Ti double-layered cap has a reflection suppressing effect equal to or better than that of the TiN cap. FIG. 11 shows the reflectance of light of the TiN (20 nm)/Ti (10 nm) double-layered cap and those of four comparative examples. In the four comparative examples, a TiN cap (single layer), Ti cap, TiW cap and capless aluminum interconnection are used, respectively. The light beams used in the measurement are "g-line", "i-line" and a KrF excimer laser beam. FIG. 10 shows that the TiN/Ti double-layered cap, like the TiN cap, has an excellent reflection suppressing effect.

Contact Resistance

Figure 12:
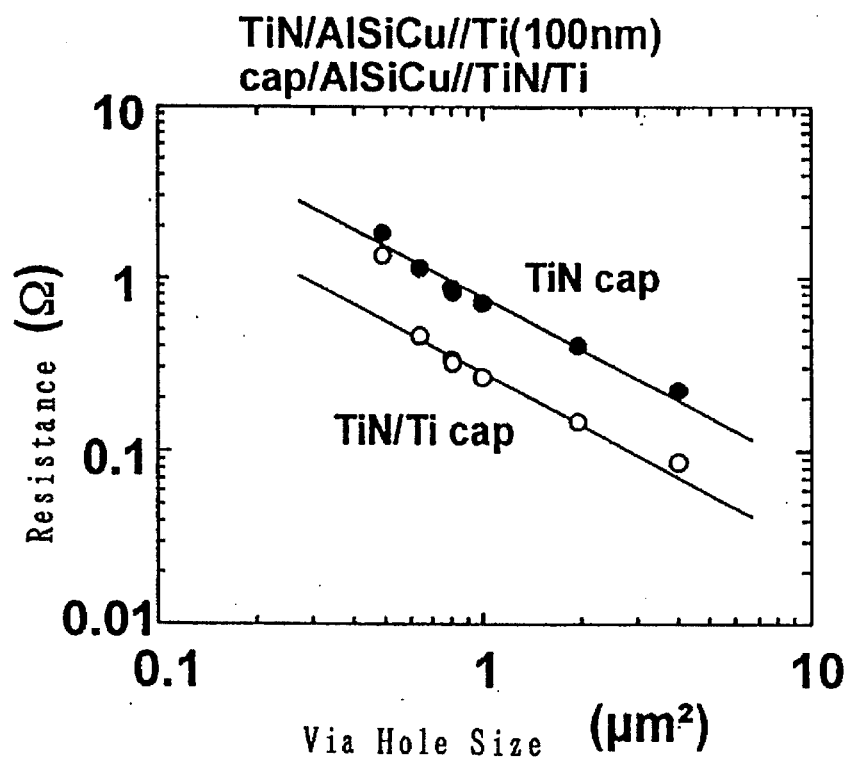

The TiN/Ti double-layered cap reduces the contact resistance (i.e., the resistance of the interconnection plug formed in the contact hole) more than the TiN cap. FIG. 12 shows the results of measuring the contact resistances of the TiN/Ti double-layered cap and TiN cap. The contact resistance of the TiN/Ti double-layered cap is lower by about $0.5 \times 10^{-8}$ $\Omega \cdot cm^2$ than that of the TiN cap.

According to the conventional TiN/Al—Si—Cu alloy structure (see FIG. 1), at the time when sputtering is carried out to form the TiN layer 103, the surface of the active aluminum alloy layer 102, which is exposed to an atmosphere of nitrogen, has an aluminum nitride layer formed thereon. The aluminum nitride generally shows an insulating characteristic and increases the contact resistance. By first forming the Ti layers 22 and 23 on the aluminum alloy layer as a conductive layer, according to this invention, the formation of aluminum nitride is prevented at the time the TiN layers 6 and 11 are formed. This reduces the contact resistance.

Although the multi-layered structure shown in FIG. 3A was annealed at 450° C. for 60 minutes, it has been confirmed that the formation of the Ti layers 22 and 23 will not generate Hillock, as in the case of the single TiN layer 103.

Second Embodiment

Figure 13:
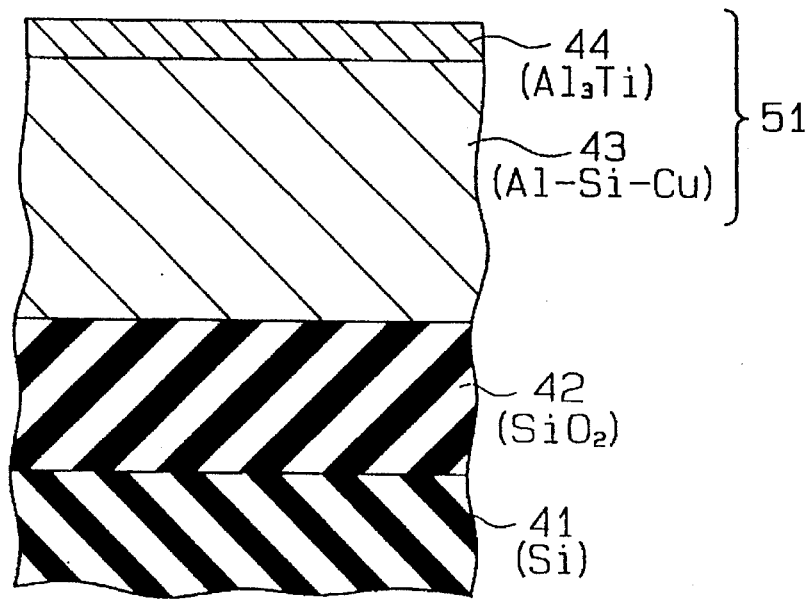

A second embodiment of the present invention will now be described referring to the accompanying drawings. FIG. 13 shows a semiconductor device according to this embodiment. A silicon oxide (SiO$_2$) film 42 is formed 200 nm thick on a single crystal silicon substrate 41 by CVD. An aluminum-silicon-copper alloy layer 43 (Al(98.5% by weight)-Si(1% by weight)-Cu(0.5% by weight)) is deposited 500 nm thick on the SiO$_2$ layer 42 through the magnetron sputtering method with a magnetron sputtering apparatus.

Figure 15A:
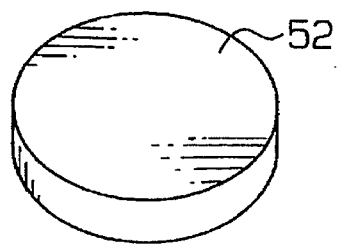
FIGS. 15A, 15B and 15C are perspective views showing a sputter target.

An aluminum-titanium alloy layer 44 (20 nm thick) on the alloy layer 43 together with the alloy layer 43 forms an interconnection layer 51 and also serves as a reflection suppressing film at the time of patterning the interconnection layer 51. This Al—Ti alloy layer 44 is formed by the magnetron sputtering method using a sputter target 52 consisting of an alloy of Al(75 atom %)-Ti(25 atom %) as shown in FIG. 15A, argon as the sputter gas, high-frequency power of 4.8 KW, and the substrate heated to 150° C.

Silicon (Si) is added to the alloy layer 43 for the purpose of inhibiting or preventing Si in the Silicon substrate 1 from being diffused into the alloy layer 3 via a contact hole (not shown) formed in the SiO$_2$ layer 2, due to the thermodynamic balance originating from the occasional heating during the fabrication of the semiconductor device. Copper (Cu) is added in the alloy layer 43 to improve the EM performance and SM performance of the interconnection layer 51.

The following description on the results of various types of measurements will clearly indicate or suggest the characteristics and advantages of the semiconductor device according to this embodiment.

Composition Analysis

It has been confirmed through X-ray diffraction that the Al—Ti alloy layer 44 consists primarily of an intermetallic compound of Al$_3$Ti with only trace amounts of Al—Ti based alloys (i.e., other intermetallic compounds or "solid solution"). The predominant element in the intermetallic compound of this composition (Al$_3$Ti) is Al, which has the lowest specific resistance among many Al—Ti based intermetallic compounds in a stable phase. Therefore, the reaction of the Al—Ti alloy layer 44 with the underlying alloy layer 43 is minimized to prevent the interconnection resistance from increasing due to such reaction. In addition, the alloy of Al$_3$Ti can be dry-etched under nearly the same conditions as the Al—Si—Cu alloy of the alloy layer 43. The stacked interconnection layer 51 in this embodiment is therefore exhibits excellent controllability, reproducibility and reliability during fabrication, and is highly suitable for industrial applications.

Reflectance

Figure 1:
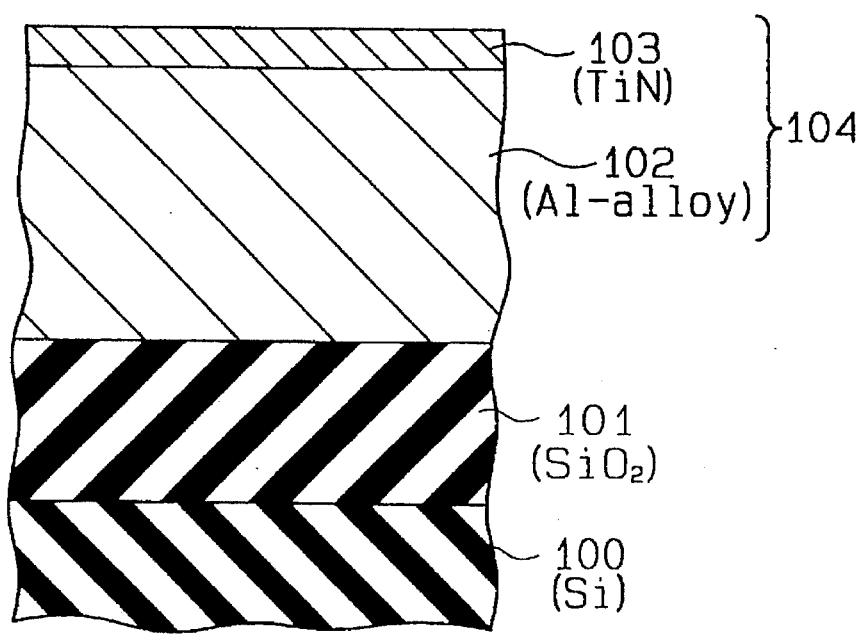
FIG. 1 is a cross-sectional view showing a part of the multi-layered structure of a conventional semiconductor device.
Figure 2:
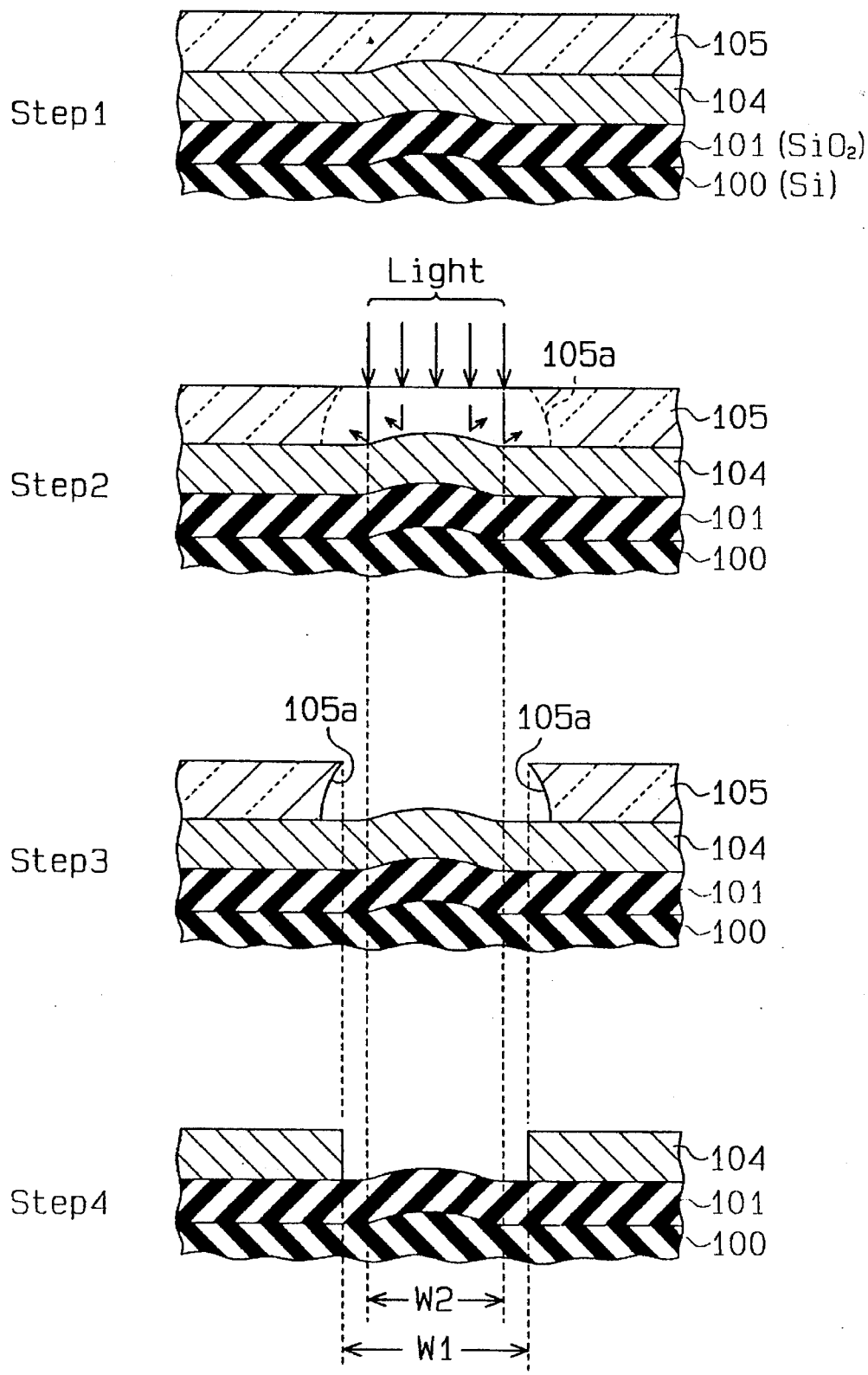
FIG. 2 shows a sequence of steps of photolithography for explaining the shortcomings of the prior art arising in the patterning of the interconnection layer of the semiconductor device.

The reflectance of the light at the surface of the interconnection layer 51 was measured with the wavelength of the light set to 365 nm, which is the wavelength of light used for exposure in the photolithographic step. The reflectance of the interconnection layer 51 having the Al$_3$Ti alloy layer 44 is about 40% to 50%, which shows a significant improvement compared with the reflectance of the interconnection layer without the alloy layer 44. As described above, the reflectance at the surface of the conventional interconnection layer 104 having the TiN layer 103, as shown in FIG. 1, is reduced to about 30%. In other words, the reflectance of the interconnection layer 51 of this embodiment is higher than that of the conventional interconnection layer 104. In this respect, the interconnection layer 51 is inferior to the conventional layer 104. This does not create a problem since the reflectance of the interconnection layer 51 is sufficient to suppress the reflection of exposure light so that the patterning precision will not be deteriorated.

EM and SM Performance

Figure 16:
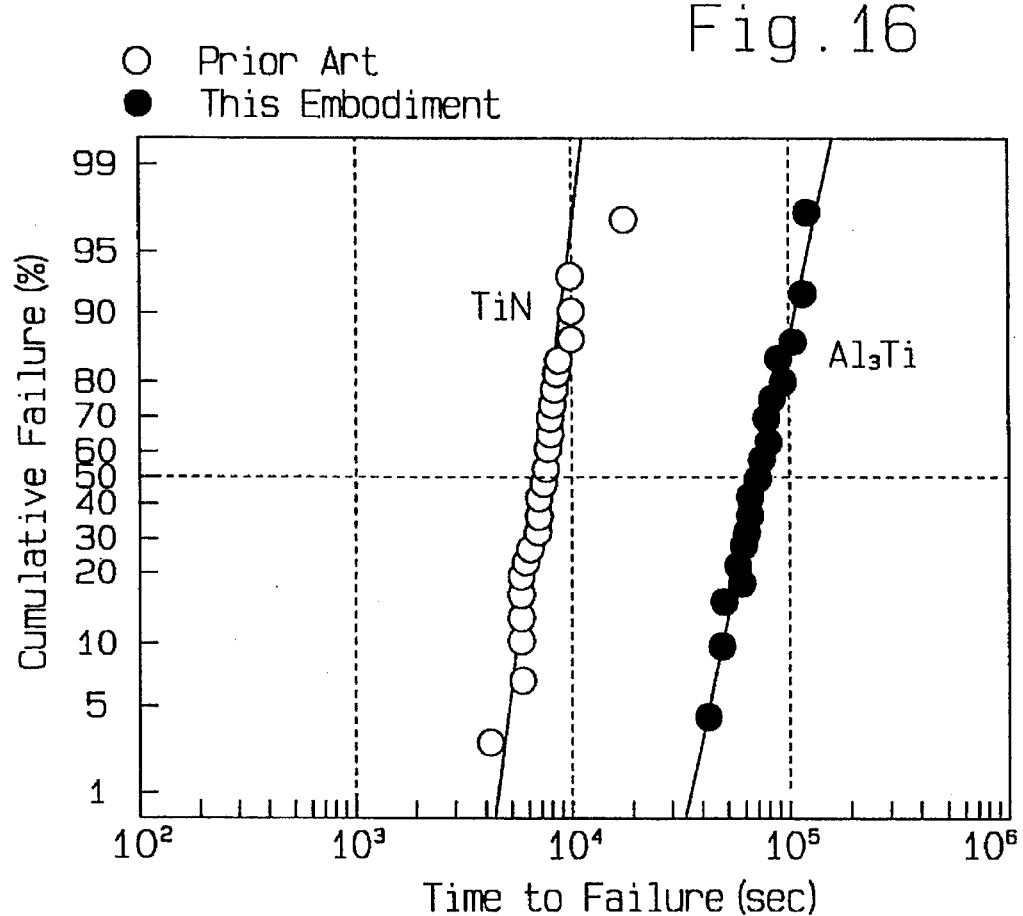

The EM performance of the semiconductor device according to this embodiment is dramatically improved as compared with the prior art shown in FIG. 1. FIG. 16 shows the EM performance of this embodiment and the prior art with the interconnection width of 4 µm. It is apparent from FIG. 16 that the EM immunity of this embodiment is increased by a factor of about ten as compared with that of the prior art. Further, it has been confirmed that the EM immunity with the interconnection width of 1 µm or narrower becomes several times larger than that in the case where the interconnection width is 4 µm. This is due to the increasing ratio of the bamboo grain boundary at the interconnection to that of the miniaturization of the interconnection, effectively reducing Al diffusion and the consequent migration of Al atoms at the grain boundary.

Figure 17:
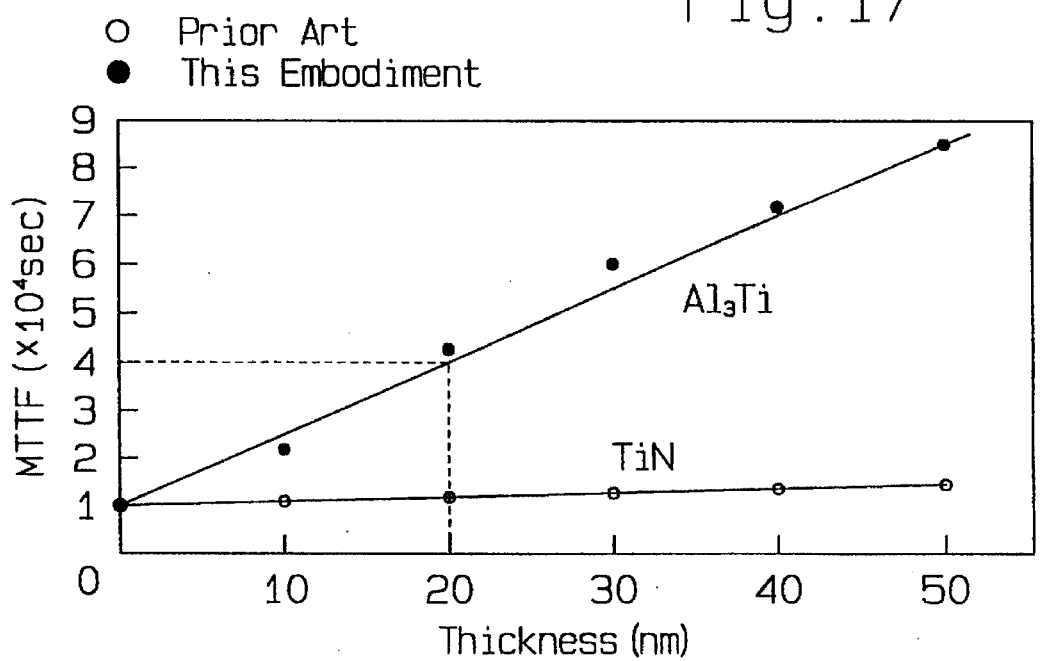

FIG. 17 shows the relation between the thickness of the reflection suppressing film and the EM immunity. With the use of the Al$_3$Ti layer 44 in this embodiment, the EM immunity which is indicated by the MTTF is proportional to the film thickness. According to the TiN layer 103 of the prior art, the EM immunity is nearly constant regardless of a change in film thickness. With the film thickness of 20 nm, the EM immunity of this embodiment is improved by a factor of about four as compared with that of the prior art. The thicker the Al₃Ti layer 44 is, the better the EM immunity becomes. When the film thickness is 20 nm or greater in particular, the superiority of the Al₃Ti layer 44 over the TiN layer 103 becomes most prominent.

In general, with an excessively thick interconnection layer 51, due for example to an increase in the thickness of the Al₃Ti layer 44, there tends to be a deterioration in the proper fabrication procedures following the photolithography (e.g. a step for forming an insulating film with CVD). The Al₃Ti layer 44, if it is too thin, will not improve the reflection suppressing performance and the EM immunity. It is therefore preferable that the range for the thickness of the Al₃Ti alloy layer 44 be 10 nm to 200 nm, more preferably 20 nm to 100 nm.

It has been confirmed that the SM immunity of the semiconductor device according to this embodiment is improved as compared with that of the prior art shown in FIG. 1.

Interconnection Resistance

The interconnection resistance of the interconnection layer 51 of this embodiment is lower than that of the prior art shown in FIG. 1. While the specific resistance of TiN is 100 to 120 $\mu\Omega$.cm, the specific resistance of the Al₃Ti alloy is 30 to 40 $\mu\Omega$.cm. Thus, the electric resistance of the Al—Ti alloy layer 44 is about one third of that of the TiN layer 103. According to this embodiment, therefore, even when a part of the interconnection alloy layer 43 is damaged due to the electromigration or stress migration, the damaged portion is bypassed by the remaining Al—Ti alloy portion and will keep ohmic contact of the interconnection layer 51. In other words, the Al—Ti alloy layer 44 serves as a low-resistance bypass for the interconnection layer 51. Because of the high resistance, however, the TiN layer 103 does not act as a bypass for the interconnection layer 104.

In short, the Al—Ti alloy layer 44 of the second embodiment will improve the EM immunity and SM immunity of the interconnection and will reduce the interconnection resistance while exhibiting a sufficient performance as the reflection suppressing film (i.e., cap metal), thereby enhancing reliability of the interconnection layer.

Although only two embodiments of the present invention have been described herein, it should be apparent to those skilled in the art that the present invention may be embodied in many other specific forms without departing from the spirit or scope of the invention. Particularly, it should be understood that the present invention may be embodied in the following manners.

Figure 15B:
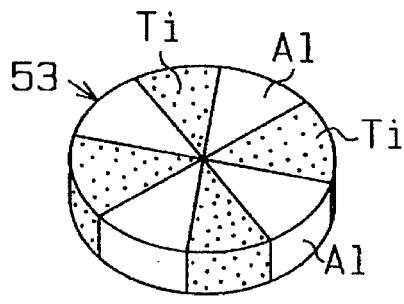
Figure 15C:
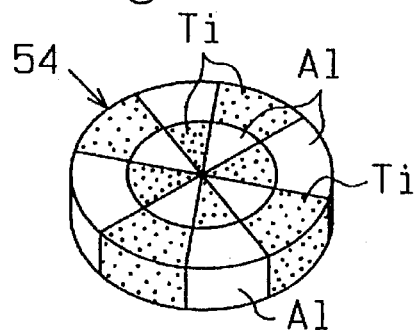

The target used in the magnetron sputtering to form the Al—Ti alloy layer 44 in the second embodiment may be a combination 53 and 54 of Ti and Al pieces as shown in FIGS. 15B and 15C instead of the Al—Ti alloy target. The Ti and Al arrangements as shown in FIGS. 15B and 15C will ensure the formation of the alloy layer 44 with a uniform composition.

By properly controlling the chemical composition of the Al—Ti alloy used as the sputter target or the ratio of Al to Ti in the combination of Al and Ti pieces in the second embodiment, the chemical composition of the Al—Ti alloy layer 44 may be changed to the composition of an Al—Ti based alloy other than Al₃Ti (e.g., AlTi or AlTi₃). Further, the composition of the Al—Ti alloy of the layers 22a and 23a in FIG. 3B may be changed to AlTi or AlTi₃ by properly controlling the sintering conditions in the first embodiment.

Metal having a specific resistance of 3 $\mu\Omega$.cm or lower, such as Al alone, Al—Si alloy containing 0.1 to 3% by weight of Si, Al—Cu alloy containing 0.1 to 0.5% by weight of Cu, gold (Au), silver (Ag) or copper (Cu) may be used as the metal for the interconnection alloy layer 43. The mentioned metals are preferable due to their easier processing. Other high-melting point metals alone, silicides thereof or alloys thereof may also be used.

In the second embodiment, a barrier-metal layer may be provided between the interconnection layer 51 and SiO₂ layer 42 as per the first embodiment. Examples of the barrier metal include Ti, TiN, titanium oxide nitride (TiON), tungsten (W), titanium tungsten (TiW), and molybdenum silicide (MoSi). This barrier-metal layer prevents silicon from being precipitated at contact portions due to the solid phase epitaxial growth, thus preventing or suppressing an increase in contact resistance. In addition, the barrier-metal layer further improves the SM immunity.

Figure 18:
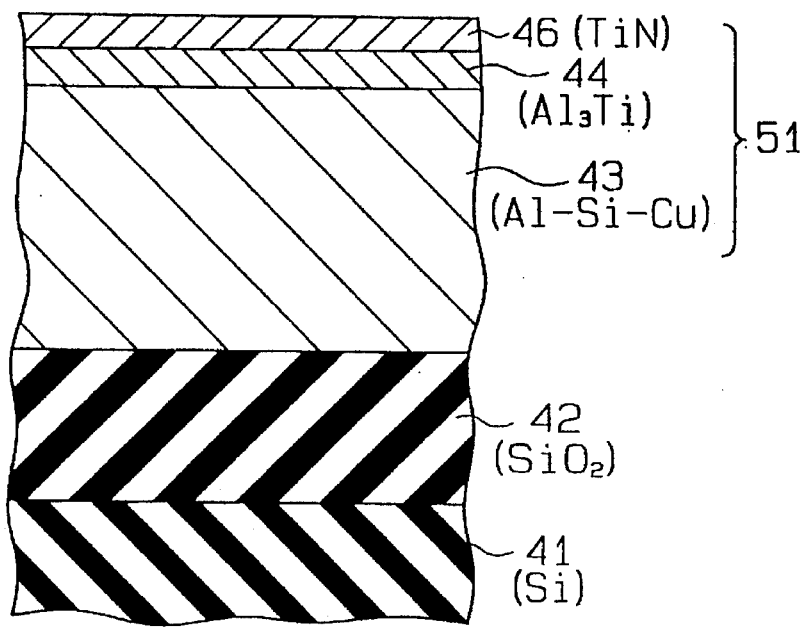
Figure 14:
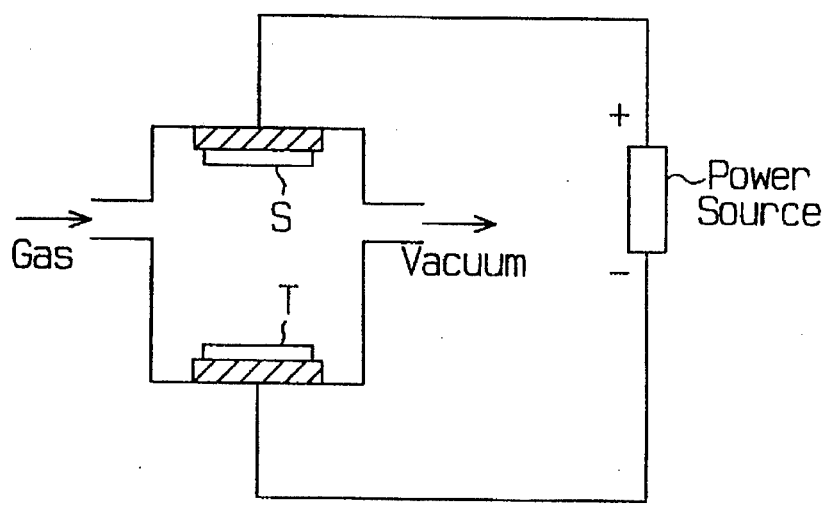

As shown in FIG. 18, an additional cap-metal layer 46 may be provided on the Al—Ti alloy layer 44 in the second embodiment. Examples of the material for the layer 46 include Ti, TiN, titanium oxide nitride (TiON), tungsten (W), titanium tungsten (TiW), and molybdenum silicide (MoSi). The additional layer 46 further improves the EM immunity and SM immunity and further reduces the interconnection resistance by the synergistic action with the Al—Ti alloy layer 44. It is particularly preferable that the cap-metal layer 46 be a TiN layer for the following reason. As the reflectance of the interconnection layer 51 is determined by the TiN layer 46, the reflectance of the structure shown in FIG. 18 becomes lower than that of the second embodiment.

Although the semiconductor devices according to the first embodiment are provided with two interconnection layers, they may respectively comprise a single interconnection layer consisting of the alloy layer 5, the Ti layer 22 and TiN layer 6. The cap metal layer 31 consisting of the Ti layer 22 and TiN layer 6 has the above-mentioned advantages.

Therefore, the present examples and embodiments are to be considered as illustrative and not restrictive and the invention is not to be limited to the details given herein, but may be modified within the scope of the appended claims.

What is claimed is:

1. A semiconductor device including an interconnection layer to form an interconnection having a desired pattern, comprising:
   a first insulating layer;
   a first conductive layer deposited over said first insulating layer;
   a titanium layer deposited on said first conductive layer; and
   a titanium nitride layer deposited on said titanium layer, wherein said interconnection layer comprises said first conductive layer, said titanium layer and said titanium nitride layer.

2. The semiconductor device according to claim 1, wherein said first conductive layer is made of conductive metal selected from the group consisting of gold (Au), silver (Ag), copper (Cu), aluminum (Al), aluminum-silicon-copper alloy, aluminum-silicon alloy, aluminum-copper alloy, aluminum-titanium alloy and aluminum alloy including any one of Magnesium (Mg), Palladium (Pd), Scandium (Sc) and Hafnium (Hf).

3. The semiconductor device according to claim 1 further comprising a barrier layer, provided between said first insulating layer and said first conductive layer, for suppressing the diffusion of atoms between said first insulating layer and said first conductive layer.

4. The semiconductor device according to claim 3, wherein said barrier layer includes a titanium layer formed on said first insulating layer and a titanium nitride layer formed on said titanium layer.

5. The semiconductor device according to claim 1 further comprising:
   a second insulating layer deposited over said first conductive layer and having a contact hole formed through said second insulating layer;
   a second conductive layer deposited over said second insulating layer; and
   a stacked filler for filling said contact hole, wherein said stacked filler includes a titanium layer facing at least said first conductive layer, a titanium nitride layer formed on the titanium layer, and an connecting insertion provided on the titanium nitride layer to electrically connect said first and second conductive layers.

6. The semiconductor device according to claim 5, wherein said connecting insertion is made of a conductive material comprising said second conductive layer.

7. The semiconductor device according to claim 5, wherein said connecting insertion is provided as a plug made of a metal selected from the group consisting of tungsten, aluminum, nickel and copper.

8. A semiconductor device including an interconnection layer to form an interconnection having a desired pattern, comprising:
   an insulating layer;
   a conductive layer deposited over said insulating layer; and
   a layer deposited on said conductive layer, for suppressing the reflection of light beams during the patterning of said interconnection layer, said reflection suppressing layer including an aluminum-titanium alloy layer and a titanium nitride layer deposited on said aluminum-titanium alloy layer, a substantial majority of said titanium of said aluminum-titanium alloy layer being present in said aluminum-titanium alloy layer when said aluminum-titanium alloy layer is deposited on said conductive layer as part of said layer for said suppressing of the reflection of light beams, and in which said titanium of said aluminum-titanium alloy layer is present in a sufficient amount for said suppressing of the reflection of light beams at the time said aluminum-titanium layer is deposited;
   wherein the interconnection layer comprises said conductive layer, said aluminum-titanium alloy layer and said titanium nitride layer.

9. The semiconductor device according to claim 8, wherein said aluminum-titanium alloy layer consists essentially of an aluminum-titanium based intermetallic compound selected from the group consisting of $Al_3Ti$, $AlTi_3$ and $AlTi$.

10. The semiconductor device according to claim 8, wherein said conductive layer is made of conductive metal selected from the group consisting of gold (Au), silver (Ag), copper (Cu), aluminum (Al), aluminum-silicon-copper alloy, aluminum-silicon alloy, aluminum-copper alloy, aluminum-titanium alloy and aluminum alloy including any one of Mg, Pd, Sc and Hf.

11. The semiconductor device according to claim 8 further comprising a barrier layer, provided between said insulating layer and said conductive layer, for suppressing diffusion of atoms between said insulating layer and said conductive layer.

12. The semiconductor device according to claim 11, wherein said barrier layer includes a titanium layer formed on said insulating layer and a titanium nitride layer formed on the titanium layer.

13. A semiconductor device including an interconnection layer to form an interconnection having a desired pattern, comprising:
   an insulating layer;
   a conductive layer deposited over said insulating layer; and
   a layer deposited on said conductive layer, for suppressing reflection of light beams at a time of patterning the interconnection layer, said reflection suppressing layer being a single layer consisting essentially of an aluminum-titanium based intermetallic compound selected from the group consisting of $Al_3Ti$, $AlTi_3$ and $AlTi$, a substantial majority of said titanium of said aluminum-titanium alloy layer being present in said aluminum-titanium alloy layer when said aluminum-titanium alloy layer is deposited on said conductive layer as part of said layer for said suppressing of the reflection of light beams, and in which said titanium of said aluminum-titanium alloy layer is present in a sufficient amount, when said aluminum-titanium alloy layer is deposited, for said suppressing of the reflection of light beams;
   wherein the interconnection layer comprises said conductive layer and said reflection suppressing layer.

14. The semiconductor device according to claim 13, wherein said aluminum-titanium based intermetallic compound is $Al_3Ti$.

15. The semiconductor device according to claim 13, wherein said conductive layer is made of conductive metal selected from the group consisting of gold (Au), silver (Ag), copper (Cu), aluminum (Al), aluminum-silicon-copper alloy, aluminum-silicon alloy, aluminum-copper alloy, aluminum-titanium alloy and aluminum alloy including any one of Magnesium (Mg), Palladium (Pd), Scandium (Sc) and Hafnium (Hf).

16. A semiconductor device comprising:
   a first conductive layer made of one of aluminum and an aluminum alloy;
   an insulating layer deposited over said first conductive layer and having a contact hole formed through said insulating layer;
   a second conductive layer deposited over said insulating layer; and
   a stacked filler for filling said contact hole, wherein said stacked filler includes a titanium layer formed on said first conductive layer, a titanium nitride layer formed on the titanium layer, and a connecting insertion provided on the titanium nitride layer to electrically connect said first and second conductive layers.

17. The semiconductor device according to claim 16, wherein said connecting insertion includes a tungsten plug.

18. A semiconductor device including an interconnection layer patterned by photolithography to form an interconnection having a desired pattern, comprising:
   an insulating layer;
   a conductive layer deposited over said insulating layer, said conductive layer being made of conductive metal selected from the group consisting of gold (Au), silver (Ag), copper (Cu), aluminum (Al), aluminum-silicon-copper alloy, aluminum-silicon alloy, aluminum-copper alloy and aluminum alloy including any one of Magnesium (Mg), Palladium (Pd), Scandium (Sc) and Hafnium (Hf); and a layer deposited on said conductive layer, for suppressing the reflection of light beams during the patterning of said interconnection layer, said reflection suppressing layer including an aluminum-titanium alloy layer and a titanium nitride layer deposited on said aluminum-titanium alloy layer, wherein the interconnection layer comprises said conductive layer, said aluminum-titanium alloy layer and said titanium nitride layer.

19. A semiconductor device including an interconnection layer patterned by photolithography to form an interconnection having a desired pattern, comprising:

an insulating layer;

a conductive layer deposited over said insulating layer, said conductive layer being made of conductive metal selected from the group consisting of gold (Au), silver (Ag), copper (Cu), aluminum (Al), aluminum-silicon-copper alloy, aluminum-silicon alloy, aluminum-copper alloy and aluminum alloy including any one of Magnesium (Mg), Palladium (Pd), Scandium (Sc) and Hafnium (Hf); and a layer deposited on said conductive layer, for suppressing reflection of light beams during the patterning of said interconnection layer, said reflection suppressing layer being a single layer consisting essentially of an aluminum-titanium based intermetallic compound selected from the group consisting of $Al_3Ti$, $AlTi_3$ and $AlTi$, wherein the interconnection layer comprises said conductive layer and said reflection suppressing layer.

* * * * *